United States Patent [19]

Scherrer

[11] 4,036,706

[45] July 19, 1977

[54] METHOD FOR PROVIDING ELECTRICAL ISOLATION BETWEEN SPACED PORTIONS OF A LAYER OF SEMICONDUCTIVE MATERIAL AND THE PRODUCT PRODUCED THEREBY

[75] Inventor: Raymond E. Scherrer, West Palm Beach, Fla.

[73] Assignee: International Telephone and Telegraph Corporation, Nutley, N.J.

[21] Appl. No.: 670,498

[22] Filed: Mar. 25, 1976

[51] Int. Cl.² ............................ C25D 5/02; C25D 7/12; C25D 5/48
[52] U.S. Cl. ............................. 204/15; 29/576 R; 29/580; 357/50
[58] Field of Search .......... 204/15; 29/576 R, 576 W, 29/577, 578, 580; 156/17; 427/88; 357/50

[56] References Cited

U.S. PATENT DOCUMENTS

| | | | |
|---|---|---|---|
| 3,912,556 | 10/1975 | Grenon et al. | 29/580 |
| 3,950,233 | 4/1976 | Rosvold | 204/15 |
| 3,968,565 | 7/1976 | Bertens et al. | 29/580 |

OTHER PUBLICATIONS

Technical Digest — International Electron Devices Meeting, Dec. 9, 10, 11, 1974, pp. 266–269.

*Primary Examiner*—T. M. Tufariello

*Attorney, Agent, or Firm*—John T. O'Halloran; Peter C. Van Der Sluys

[57] ABSTRACT

A semiconductor device has a plurality of electronic elements formed in spaced portions of a layer of semiconductive material which is disposed on a substrate. Electrical isolation is provided between the spaced portions by a layer of dielectric material formed on the peripheral surfaces of the spaced portions and on the substrate. Metal is disposed on the dielectric layer in said spaces for filling the spaces and providing a planar surface. The isolation is provided by forming a dielectric layer over the surface of the semiconductor device and thereafter removing the dielectric and the semiconductive material of the layer in regions between the portions of the layer in which the elements are formed to expose the substrate. A dielectric layer is then formed on the exposed substrate and the peripheral surfaces of the spaced portions. A metal is deposited onto the semiconductor device so that metal layers are formed on the substrate dielectric and on the surface dielectric, said metal layers being electrically isolated from each other. The metal layer on the substrate dielectric is electrolytically treated to change its surface characteristics after which the untreated metal on the surface dielectric is etched using a compound that attacks the untreated metal but has little or no effect on the treated metal on the substrate dielectric. Additional metal is plated onto the metal on the substrate dielectric to fill the entire space and provide a planar surface.

10 Claims, 21 Drawing Figures

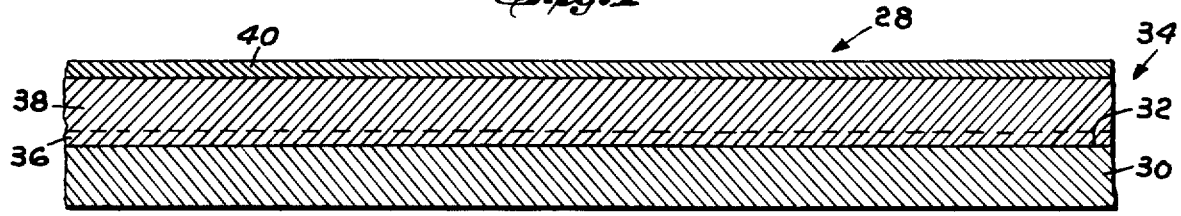
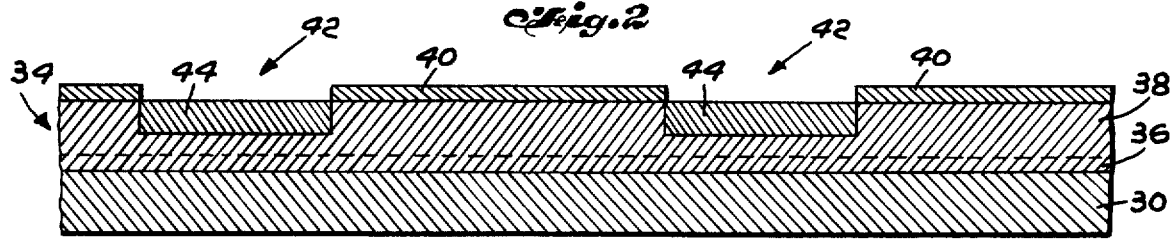
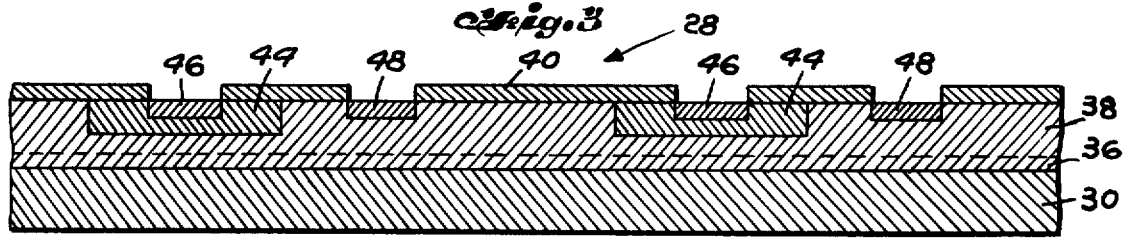
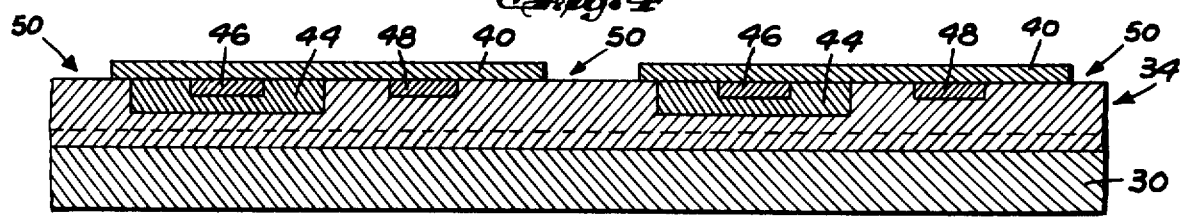
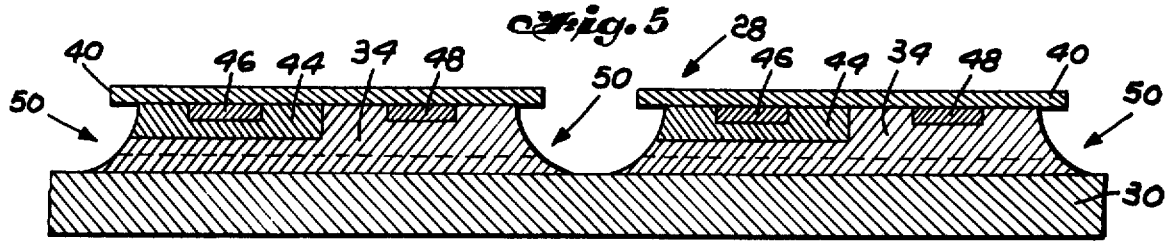
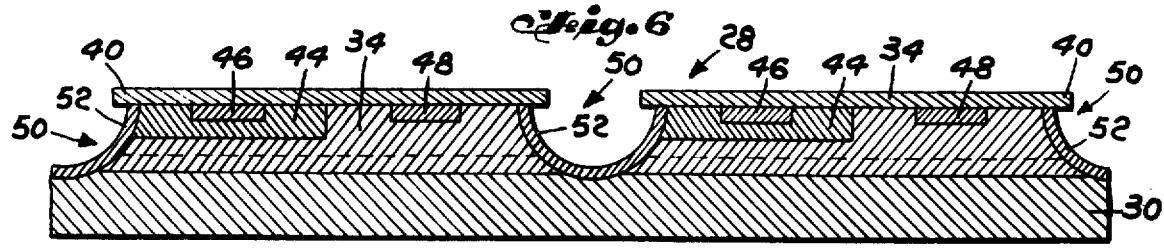

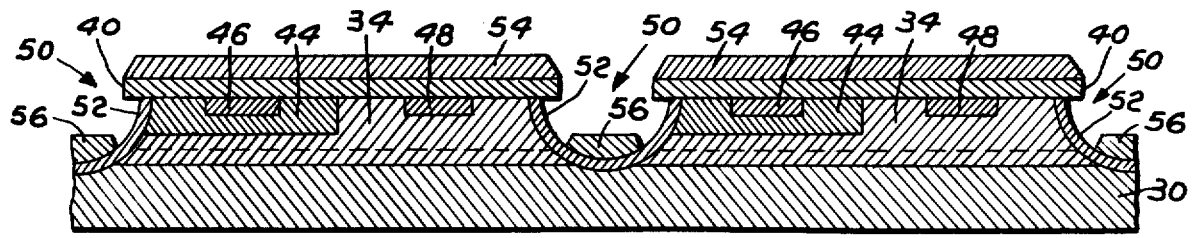
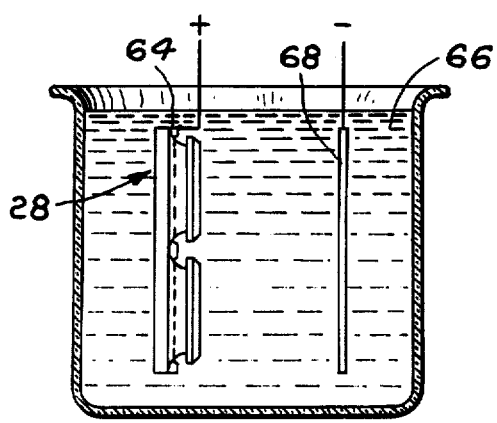
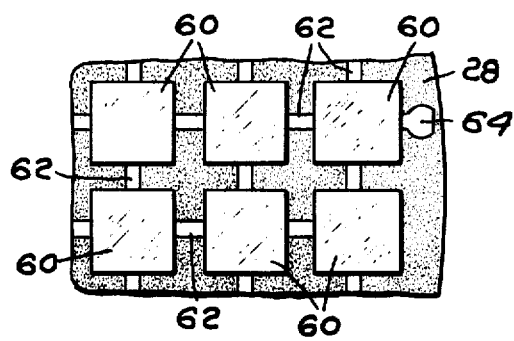
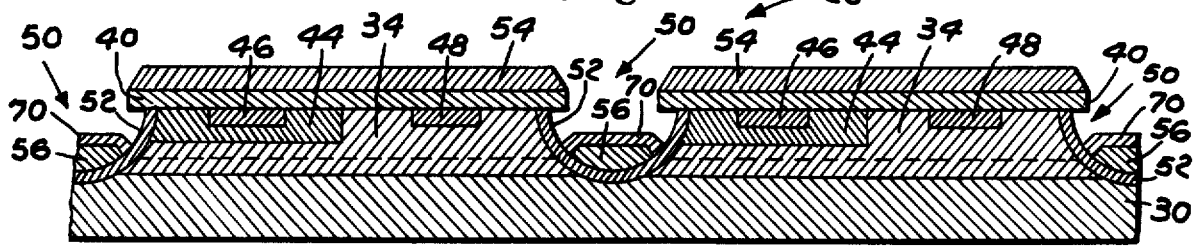
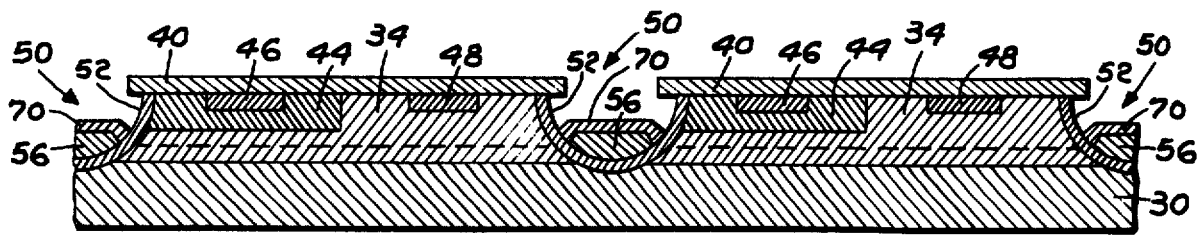

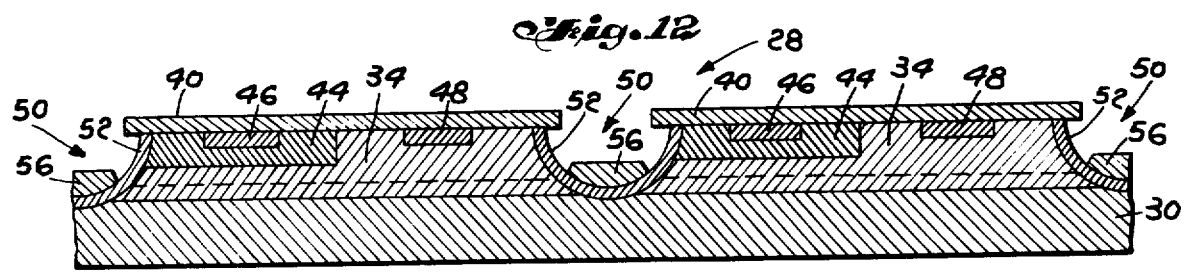
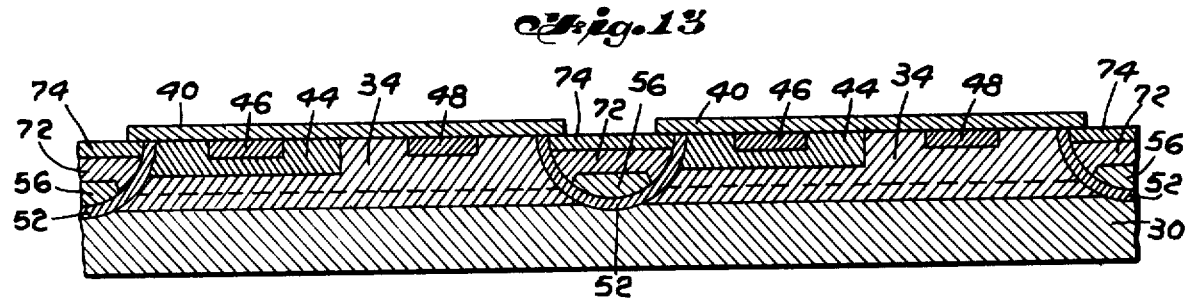
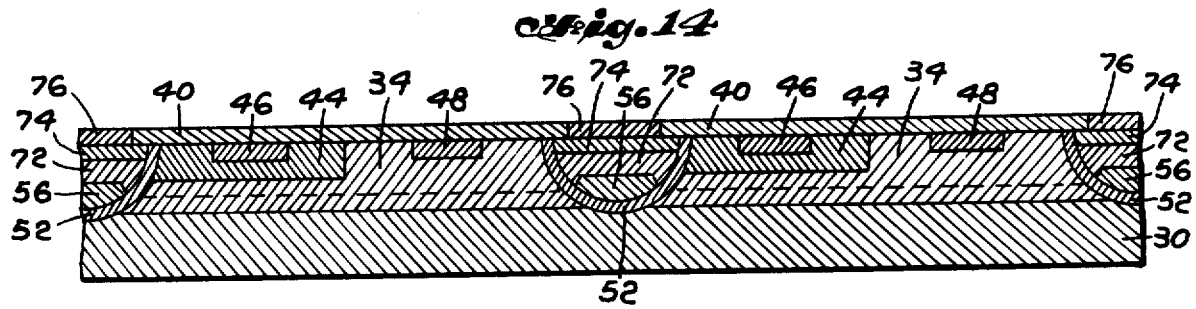
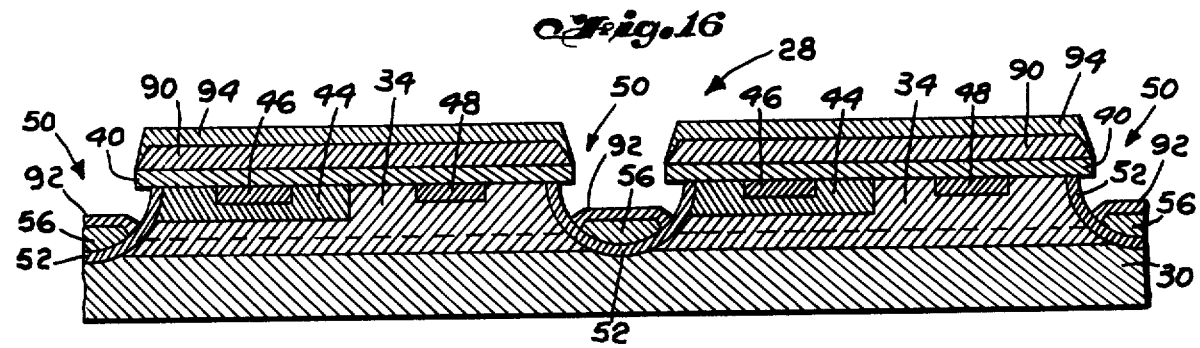
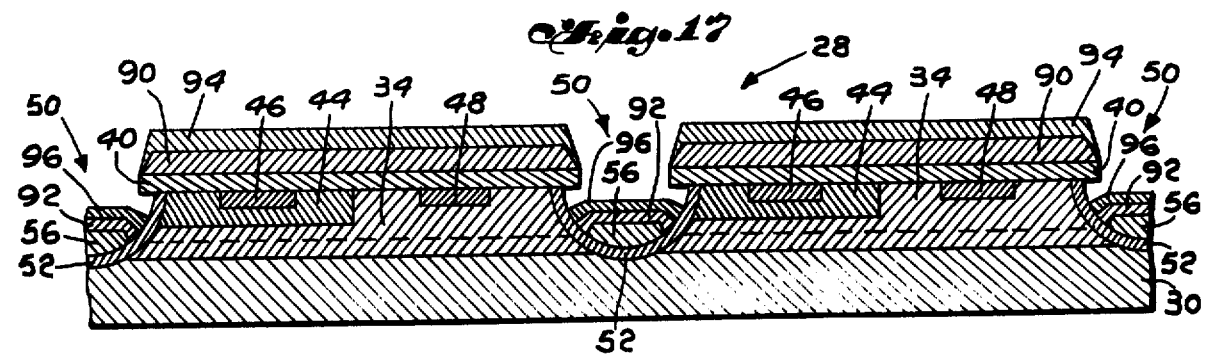

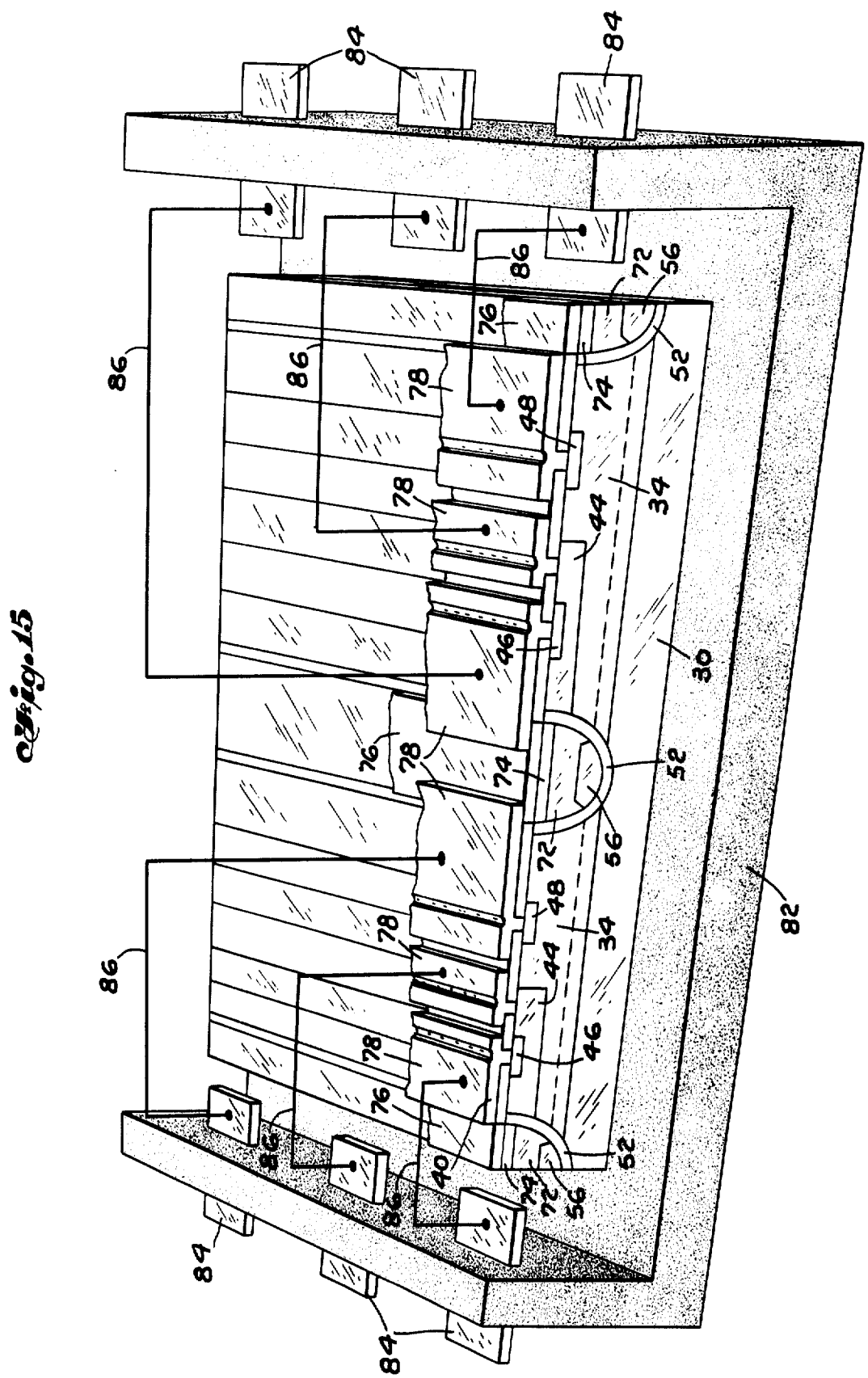

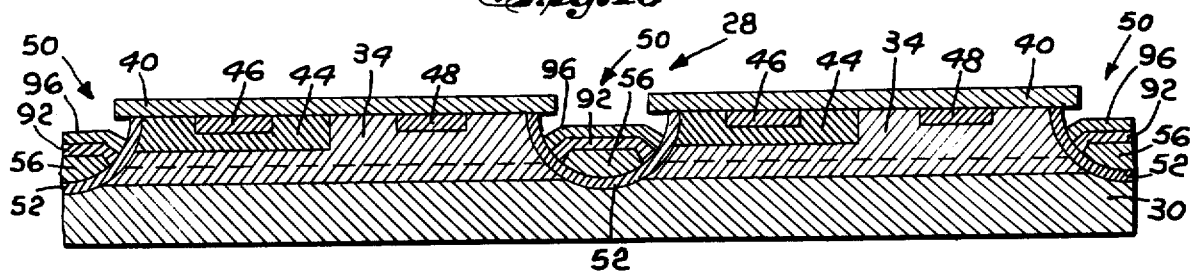
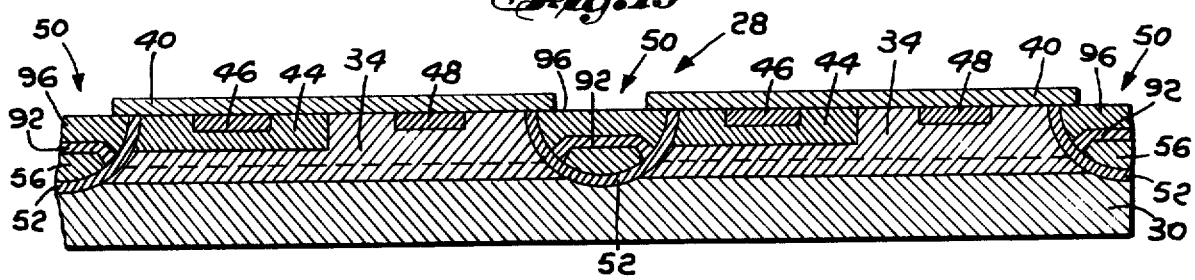
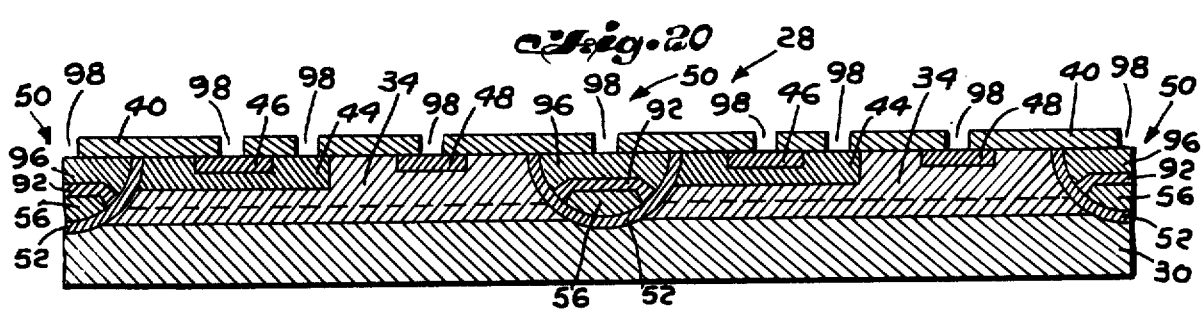
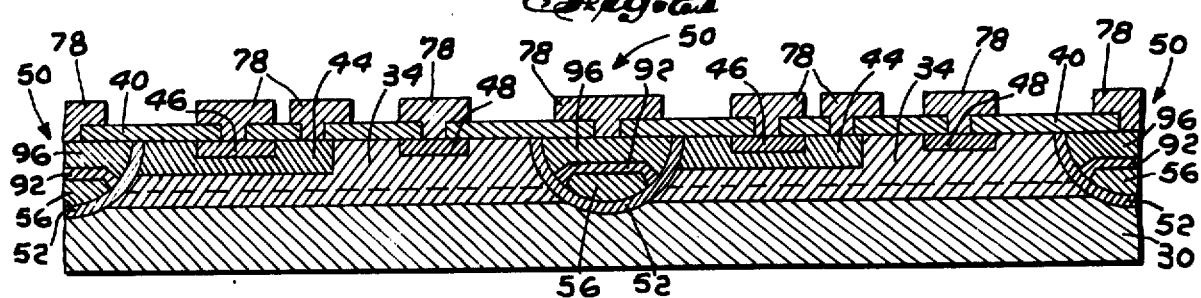

4,036,706

METHOD FOR PROVIDING ELECTRICAL ISOLATION BETWEEN SPACED PORTIONS OF A LAYER OF SEMICONDUCTIVE MATERIAL AND THE PRODUCT PRODUCED THEREBY

BACKGROUND OF THE INVENTION

1. Field of the Invention

This invention relates generally to a method for providing electrical isolation in semiconductor devices and more particularly to a method for fabricating an integrated circuit having electrical isolation between functional elements thereof.

2. Description of the Prior Art

Heretofore a number of methods have been used to provide isolation between functional elements in integrated circuit devices; however, most of these have proven to be either ineffective or impractical due to high cost.

A first isolating method provided isolation using back to back PN junctions. The junctions were formed by diffusing P-type impurities into an N-type epitaxial layer until the P-type diffusion extended through the entire epitaxial layer to a P-type substrate. In order to achieve high saturation currents, a layer of high concentration N-type impurity is usually formed by diffusion prior to growing the epitaxial layer. Since it is difficult to diffuse sufficient P-type impurities through the epitaxial layer to overcome the high concentration of N-type, it was essential that a mask be used during the diffusion of the N-type impurities so that the high concentration was not present in the regions where P-type impurities were to be diffused. Thus, two diffusion steps were required, each step requiring a separate mask. The need for two masks and two high temperature diffusion steps increased the cost of the fabricated device and also degraded the semiconductor material.

In an attempt to eliminate a masking operation and one of the high temperature diffusion steps, a double epitaxial layer of N-type semiconductivity was formed on a P-type substrate. A first layer had a high N-type impurity concentration and the second layer a standard N-type impurity concentration. The isolation was provided by P-type diffusion through the double epitaxial layer to the P-type substrate to form PN junctions; however, it was difficult to properly diffuse P-type impurities through the high N-type impurity concentration in the first epitaxial layer. As a result, the P-type diffusion step had to extend over long periods of time that proved impractical and contributed to the degradation of the semiconductor material.

In another method for providing isolation, the silicon in the isolating region was partially etched and thereafter oxidized to form a dielectric, silicon dioxide; however, it was discovered that in order to provide the proper thickness of silicon dioxide, an oxidation period of approximately 10 hours at 1,000° C was required and this also proved to be both time consuming and detrimental to the semiconductor material.

Another method of providing isolation required the formation of channels or valleys in a single crystal semiconductor material. A layer of polycrystalline silicon was then formed over the channels. The single crystal silicon was lapped off to expose isolating regions of polycrystalline silicon which formed a substrate having isolated regions of single crystal silicon which formed the active elements of the circuit. This lapping process proved to be extremely expensive and time consuming and did not provide a satisfactory solution to the isolation requirement.

Thus, all the prior art methods suffered from some deficiency. The methods were either time consuming, too expensive or degraded the semiconductor material due to excessive exposure to extreme temperatures.

In commonly assigned copending U.S. patent application, Ser. Nos. 524,296, and 601,855 filed Nov. 15, 1974, and Aug. 4, 1975 respectively, the use of an anodized metal and anodized silicon for providing electrical isolation between functional elements in an integrated circuit is taught. An anodized dielectric provided satisfactory isolation and eliminated the difficulties encountered with PN junction isolation techniques and the resulting capacitance formed across the junction. In order to provide an anodic film thick enough to completely isolate the functional elements, a porous anodic film was required. It was discovered that a porous anodic film would result if the proper type of electrolyte was used during anodization.

The use of a dielectric formed by anodization proved to be extremely effective and substantially reduced the cost of producing integrated circuit devices. However, some difficulty was experienced in providing metallization over the interface between the dielectric and the adjacent semiconductive material since there was a tendency for gaps to form about the edges of the dielectric and this could result in an open circuit in the subsequently applied metallurgy patterns.

SUMMARY OF THE INVENTION

The present invention comtemplates electrical isolation for semiconductor devices wherein a space between functional electronic elements in a layer of semiconductor material is completely filled and a smooth planar surface is provided for the subsequent application of dielectric material and metallurgy patterns. The present invention incorporates many of the desirable features of the previously mentioned applications in that it eliminates high temperature processing steps and masking operations which were required in the prior art isolation techniques. The difficulties encountered with PN junction isolation techniques and the resulting capacitance formed across the junctions are eliminated and the high temperature required for the formation of thick silicon dioxide dielectric layers is also avoided.

The present invention uniquely provides a method for selectively filling in the isolation regions to provide a planar surface and does not require a lapping or polishing step to remove undesired material from the surface of the semiconductor device.

Functional electronic elements are formed in spaced portions of a layer of semiconductive material which is disposed on a substrate. A protective dielectric layer is formed on the surface of the semiconductive material and thereafter the protective dielectric layer and the semiconductive material are etched away in selected isolation regions between the spaced portions to expose the substrate material. A dielectric layer is then formed on the exposed surfaces of the substrate material and the peripheral surfaces of the spaced portions. A metal is deposited over the semiconductor device to form layers of metal over the substrate dielectric and over the surface dielectric. The layer of metal on the substrate dielectric is electrically isolated from the metal on the surface dielectric and may therefore be electrolytically treated by anodizing or plating, to provide a protective material over the surface without affecting the material deposited on the surface dielectric. After the metal on the substrate dielectric is treated, the metal on the surface dielectric may be selectively removed by etching with a compound that attacks the pure surface metal but has little or no effect on the treated substrate metal. The space between the spaced portions may then be filled with metal using a plating process to build up a layer of metal until a planar surface is again realized. After establishing the planar surface, the normal processing steps may be followed to form an integrated circuit including the metallization of the contact regions and interconnecting metallurgy patterns.

Thus, the present invention eliminates high temperature diffusion steps and a masking operation which would be required for junction type of isolation, thereby reducing the cost of the integrated circuit device and reducing the degradation normally resulting from high temperature diffusion steps.

The invention also allows the metal in the isolation regions to function as an interconnecting electrical bus if desired.

The plated metal totally fills the space between the active elements and does not leave a gap around the interface between the isolation region and the active regions and therefore overcomes problems experienced with the prior art devices.

The primary objective of the present invention is to provide a method for forming electrical isolation regions in semiconductor material.

Another objective of the present invention is to provide a process for forming electrical isolation regions between functional elements in an integrated circuit device.

Another objective of the present invention is to provide a semiconductor device that is less expensive and more reliable than those heretofore provided.

Another objective of the present invention is to provide a method for forming both an electrical isolation region between the functional elements of an integrated circuit and an interconnecting bus for said circuit.

The foregoing and other objectives and advantages of the present invention will become more apparent from the following description and the accompanying drawings wherein two embodiments of the present invention is described.

BRIEF DESCRIPTION OF THE DRAWINGS

FIGS. 1 through 7 are cross-sectional views of a portion of an integrated circuit shown at various stages of fabrication in accordance with a first embodiment of the present invention.

FIG. 8 is a plan view of a portion of a slice of semiconductive material having a plurality of integrated circuit elements formed thereon with an interconnecting bus.

FIG. 9 is a diagrammatic representation of one step in the process of the present invention.

FIGS. 10 through 14 are cross-sectional views of a portion of an integrated circuit shown at various stages of fabrication in accordance with the first embodiment of the present invention.

FIG. 15 is a cross-sectional view showing a packaged integrated circuit.

FIGS. 16 through 21 are cross-sectional views of a portion of an integrated circuit shown at various stages in the fabrication in accordance with a second embodiment of the present invention.

DESCRIPTION OF THE INVENTION

Referring to FIG. 1, there is shown a portion of a semiconductor wafer 28 having a substrate 30 formed of a standard slice of semiconductive material, preferably silicon, having a P-type semiconductivity and a resistivity of approximately 1 to 3 ohm cm; however, it is to be understood that N-type semiconductive material could also be used. The slide is polished to attain a monocrystalline surface 32 on which there is grown an epitaxial layer 34 of N-type semiconductive material. The epitaxial layer 34 should be grown so that it has a high N+ impurity concentration adjacent surface 32 and a standard N impurity concentration throughout the remainder of the layer. The variation in impurity concentration may be achieved by growing the layer with a graded impurity concentration varying from a high N+ concentration initially to a lower N concentration at the termination of the growth. Alternatively, two distinct layers may be grown such as layer 36 having a high N+ impurity concentration and a layer 38 having a standard N impurity concentration.

The epitaxial layer may be grown using impurity atoms of phosphorus, arsenic, or antimony, which provide for the N type semiconductivity of the layer. Layer 36 has a higher impurity concentration and is formed during an epitaxial process at a temperature of approximately 1200° C and an impurity concentration equal to or greater than $2 \times 10^{17}$ atoms per ccm. This growth is continued for approximately one minute to provide a layer having a thickness of approximately 1 micron. The growth is then continued with an impurity concentration of approximately $1 \times 10^{16}$ atoms per ccm for a period of approximately 7 minutes to form a layer 38 having a thickness of approximately 6 to 7 microns. The above method provides two distinct layers 36 and 38 having different impurity concentrations. If desired, a graded impurity concentration may be provided by growing the epitaxial layer for 1 minute with a concentration of $2 \times 10^{17}$ or more impurity atoms per ccm and thereafter cutting off the impurity source while continuing the epitaxial growth. The residual impurity atoms form the graded concentration. The high N+ concentration in layer 36 provides a low saturation resistance allowing for high current density switching in the resulting semiconductor device.

The N-type semiconductive layer 36 shown in FIG. 1 is preferably formed through the use of an epitaxial growth as previously described; however, for the purposes of the present invention, a diffusion step may be used to form the N+ layer 36 and thereafter 38 may be formed using a standard concentration epitaxial growth.

After forming the epitaxial layer 34, the semiconductive material is subjected to an oxidizing process so as to form a dielectric layer 40 over the entire surface of the epitaxial layer.

While oxidizing the semiconductive material is the preferred method for providing the dielectric layer 40, the layer may be formed by deposition of silicon nitride or an oxide that is both a dielectric and is resistant to silicon etch.

Using a conventional process, such as a photo-resist process, selected regions 42 of layer 40 are removed by etching to expose the N-type semiconductive material in layer 34. The remaining portions of layer 40 form a mask as shown in FIG. 2. Using layer 40 as a mask, two base regions 44 having P-type semiconductivity are formed by a P-type diffusion process. After diffusing the two base regions 44, the oxide mask 40 is again reformed and etched to expose emitter regions 46 and collector-contact regions 48 which are formed by an N-type diffusion process as shown in FIG. 3. Thus, NPN-type transistor elements have been formed in wafer 28; however, these elements must be isolated before an operative semiconductor device may be made.

Referring to FIG. 4, the dielectric layer 40 is reformed on the surface and portions of the dielectric are removed from above selected isolation regions 50 between the active elements using photo-resist techniques to thereby form a mask from layer 40 as shown. The N-type semiconductive material exposed in regions 50 is etched away to remove all of the N-type semiconductive material, beneath regions 50 and to expose the P-type semiconductive substrate 30 in regions 50 as shown in FIG. 5 thereby forming spaced portions of layer 34. The silicon material may be etched using an HF—HNO₃ etching solution.

The wafer 28 is then subjected to a steam thermal oxidation treatment for a period of approximately ten minutes to generate an oxide isolation layer 52 having a thickness of approximately 1000A over the exposed surface of the semiconductive material as shown in FIG. 6. Oxide layer 52 covers both the exposed substrate 30 and the exposed peripheral walls of the spaced portions of layer 34.

A metal, preferably aluminum, is vacuum-evaported onto the wafer 28 to form a conductive layer 54 on the surface dielectric 40 and a conductive layer 56 on the substrate dielectric 52 as shown in FIG. 7. Surface dielectric 40 electrically isolates layer 54 from the epitaxial layer 34 and substrate dielectric 52 electrically isolates layer 56 from substrate 30 and the peripheral walls of the spaced portions of layer 34. The layers 54 and 56 are formed with a thickness of approximately 1 micron so that layer 54 is spaced from and electrically isolated from layer 56.

The next step is to electrolytically treat layer 56 to change its surface characteristics. Since layer 56 is electrically isolated from the semiconductive material by the substrate dielectric 52, a means must be provided to make an electrical contact to layer 56. Referring to FIG. 8, there is shown a part of wafer 28 having a plurality of integrated circuit devices 60 formed thereon with channels 62 of metal interconnecting each of said devices. Channels 62 are merely extensions of regions 50 with layer 56 providing an interconnecting bus. A single contact point 64 is provided for applying an electrical potential to layer 56 throughout wafer 28.

The aluminum layer 56 is then partially anodized by applying a positive potential directly to contact 64, which is connected to channels 62 and the aluminum layer 56, while submerging the wafer 28 in an anodizing solution containing an electrolyte 66 and a cathode 68 as shown in FIG. 9. The electrolyte 66 is preferably H₂SO₄; however, many other electrolytes may be used for this purpose. A potential of approximately 7 volts is applied to the contact 64 and said potential develops a current of approximately 30 milliamps. Anodizing is continued for a period of about 5 minutes to form a thin anodized aluminum layer 70 as shown in FIG. 10.

The wafer 28 is then removed from the electrolyte 66 and etched in a solution of ferric chloride or a bromine compound which removes the non-anodized aluminum layer 54 while having little or no effect on the anodized aluminum layer 70 and the unanodized aluminum in layer 56. It is to be understood that any etching solution that attacks pure aluminum but has little or no effect on anodized aluminum could be used to strip layer 54 from the wafer and result in a structure as shown in FIG. 11. After the pure aluminum is etched off, the slice is placed in an HF etching solution and the anodized layer 70 is etched off to expose the unanodized aluminum in layer 56 as shown in FIG. 12.

Electrical contact is again made to contact 64 and the wafer is placed in a molybdenum plating bath similar to that shown in FIG. 9 and a layer of molybdenum 72, having a thickness of approximately 4 microns, is plated on the layer 56. After the molybdenum is plated, the wafer is then placed in a tantalum plating bath, and a tantalum layer 74 having a thickness of approximately 1 micron is plated on the molybdenum layer as shown in FIG. 13.

The wafer is again placed in an anodizing solution as shown in FIG. 9 with a positive potential being applied to contact 64 and the anodizing solution containing a 2% nitric acid solution or a sulfuric acid electrolyte, so that the tantalum is anodized to a thickness sufficient to provide good electrical isolation between the surface of the device and the unanodized metal below as shown in FIG. 14. It is to be noted that the unanodized metal beneath the anodized tantalum layer 76 forms an isolated bus that may be useful as an interconnecting bus for the integrated circuit.

Emitter, base and collector contacts are then formed on the wafer by removing selected portions of the oxide layer 40 from the surface and thereafter evaporating an aluminum layer 78 over the entire device to make contact with the exposed semiconductive material at the contact regions. The undesired portion of the aluminum is then removed using a photo-resist process so that the contacts may be isolated from each other.

At this point, the wafer is ready for testing and further processing which includes scribing, breaking into dice and encapsulation of the dice. Referring to FIG. 15, there is shown the integrated circuit die mounted on the base of a package 82 which is usually formed of a glass-like material depending upon the requirements of the device. The package has contact leads 84 extending therethrough and to which contact points of layer 78 are connected by fine wire bonds 86. The package is then sealed using any of a number of well-known techniques, such as the application of a glass frit.

The embodiment previously described provides for complete isolation between active elements of an integrated circuit using a dielectric layer formed on the peripheral surfaces of the spaced portions of the epitaxial layers containing the functional electronic elements and thereafter filling the space between the functional elements with a conductive metal using a plating process to completely fill the space and avoid any gaps that may result about the edge of the isolating region. The unique combination of plating, etching and anodizing steps provide an improved method to remove the undesired aluminum from the surface of the wafer without the need for an expensive lapping operation.

In the previously described embodiment, molybdenum and tantalum were plated onto the aluminum layer 56. The plating of molybdenum and tantalum must be conducted under controlled conditions which may make the method undesirable to certain manufacturers. Thus, another embodiment of the present invention is to be described that avoids the necessity for plating molybdenum and tantalum.

The process used to form the second embodiment follows the steps described for FIGS. 1 through 6 of the first embodiment to provide a dielectric layer 52 in the regions 50 and a dielectric layer 40 on the surface of the wafer 28; therefore, those steps need not be repeated in describing the second embodiment of the invention.

The wafer as shown in FIG. 6 is subjected to a vacuum evaporation of aluminum which forms a layer of aluminum 56 on the substrate dielectric 52 within the regions 50 and a layer of aluminum 90 formed on surface dielectric 40. The evaporation is continued so that the thickness of the aluminum layers is approximately 2500 angstroms. After the aluminum is evaporated, the wafer is subjected to a copper evaporation process to form a copper layer 92 on layer 56 in regions 50 and a copper layer 94 on the surface of layer 90 as shown most clearly in FIG. 16. The evaporation of copper is continued to form a layer having a thickness of approximately 2,000 angstroms. The dielectric layer 40 electrically isolates layers 90 and 94 from the semiconductive material and the layers 56 and 92 are isolated by the substrate dielectric 52. Layers 56 and 92 are spaced from the layers 90 and 94 so that electrical contact is not made therebetween. An interconnecting matrix is provided so that the layers 56 and 92 are electrically connected throughout the entire wafer using a structure as shown in FIG. 8 and previously described.

Electrical contact is made to point 64 shown in FIG. 8 so that a potential may be applied to layers 56 and 92 and the wafer is placed in a nickel plating bath and plated for a period of approximately 10 minutes to form a nickel layer 96 as shown in FIG. 17. The wafer is then removed from the nickel plating bath and etched with a 25% hydrochloric acid solution which has little or no effect on nickel but attacks aluminum and copper, thereby removing the copper and aluminum layers 90 and 94 from the surface of the wafer as shown in FIG. 18. It is to be understood that any etchant that has little effect on nickel and attacks aluminum and copper may be used in the present invention. The present invention contemplates the combination of other metals and other etchants that will selectively etch metal from the surface of the wafer while not attacking the metal that is disposed on the substrate dielectric. After etching the aluminum and copper from the surface of the wafer the wafer is again placed in the nickel plating bath and plated until the nickel attains a thickness sufficient to provide a planar surface with the semiconductive material as shown most clearly in FIG. 19.

Referring to FIG. 20, a dielectric layer is again formed over the surface of the wafer, said dielectric layer may be in the form of $SiO_2$ or a deposited layer of vapox having a thickness of approximately 1 micron. Contact openings 98 are thereafter etched in the dielectric layer in selected contact regions as shown in FIG. 20. A layer of aluminum 78 is evaporated over the surface to form contact with the selected regions in a semiconductor material. The aluminum is then etched using a photoresist process to provide isolation between the various contacts on the wafer as shown in FIG. 21. The wafer 28 shown in FIG. 21 has electrical isolation between active regions of the layer 34 and has an insulated interconnecting bus formed by the layers of aluminum, copper and nickel.

The wafer shown in FIG. 21 is in condition for testing, scribing, breaking and, die encapsulation as previously described in relation to FIG. 15.

The present invention provides electrical isolation between spaced portions of a layer of semiconductive material using a layer of dielectric on the peripheral surfaces of the spaced portions and thereafter plating metal into the space between the portions to provide a planar surface. When the process is used in the fabrication of integrated circuits, the high temperatured diffusion steps and the masking operations associated with the isolation procedures of the prior art are eliminated. The use of a dielectric material as an insulator between active elements in an integrated circuit provides advantages over the prior art and in particular, it eliminates the problems encountered with the parasitic capacitance associated with the PN junction type of isolation. The plated metals completely fill the isolation regions and results in a planar device without a gap between the isolation region and the semiconductive material. The plated metal provides a convenient interconnecting bus for the integrated circuit. Thus the present invention provides an inexpensive but effective way of providing isolation between the active elements of an integrated circuit and overcomes many of the problems associated with the prior art.

What is claimed is:

1. A method for providing electrical isolation in semiconductive material while maintaining a planar surface, comprising the steps of:
    removing the semiconductive material from regions of a planar surface in which isolation is desired to form an isolation moat;
    forming a dielectric layer on the surfaces of the semiconductive material defining the moat;
    depositing a metal over the semiconductive material so that the metal covers the planar surface of the semiconductive material and only a portion of the surfaces defining the isolation moat;
    forming a protective layer over the metal deposited in the isolation moat;
    selectively removing the metal deposited on the planar surface of the semiconductive material using an etchant that attacks said metal but has little or no effect on the protective layer; and
    selectively plating metal into the isolation moat to substantially fill said moat and provide a planar surface with the semiconductive material.

2. A method as described in claim 1, wherein the step of forming a protective layer over the metal deposited in the isolation moat comprises the step of electrolytically treating the deposited metal in the isolation moat to modify the surface characteristics of said metal so that it may be distinguished from the metal on the surface of the semiconductive material.

3. A method as described in claim 2, wherein the electrolytic treating of the metal in the isolation regions comprises the step of anodizing a portion of said metal so that it has a different surface characteristic.

4. A method as described in claim 2, wherein the step of electrolytically treating comprises the step of plating a different metal onto the surface of the deposited metal, said plated metal having different characteristics than the deposited metal so that it will not be attacked by the etch.

5. A method as described in claim 2, wherein the electrolytically treated portion of the metal is removed from the isolation region after the surface metal is removed and thereafter the plated metal is applied to the deposited metal.

6. A method as described in claim 2, wherein the deposited metal in the isolation regions is anodized to provide a layer of anodized metal on the surface of the deposited metal and the unanodized metal on the surface of the semiconductive material is removed by etching in a solution that does not attack the anodized metal but removes the unanodized metal.

7. A method as described in claim 6, additionally comprising the step of removing the anodized metal from the isolation region and thereafter plating the additional metal layers onto the surface of the deposited metal.

8. A method as described in claim 1, wherein the step of depositing a metal comprises the step of depositing a first metal over the seimconductive material and thereafter depositing a second metal thereon.

9. A method as described in claim 8, wherein a layer of plated metal is formed on the second layer of deposited metal in the isolation regions and thereafter the layers of deposited metal on the surface of the semiconductive material are removed using an etch that attacks the deposited metal but has little or no effect on the plated metal.

10. A method as described in claim 9, wherein additional metal is plated onto the plated metal after the deposited metal is etched from the surface of the semiconductive material.

* * * * *